United States Patent
Kiji

(10) Patent No.: US 7,259,631 B2
(45) Date of Patent: Aug. 21, 2007

(54) PHOTORECEPTOR AMPLIFIER CIRCUIT AND OPTICAL PICKUP

(75) Inventor: Hitoshi Kiji, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 161 days.

(21) Appl. No.: 11/177,455

(22) Filed: Jul. 7, 2005

(65) Prior Publication Data

US 2006/0006312 A1 Jan. 12, 2006

(30) Foreign Application Priority Data

Jul. 9, 2004 (JP) ............................. 2004-203934

(51) Int. Cl.
*H03F 3/08* (2006.01)
(52) U.S. Cl. ...................................... 330/308
(58) Field of Classification Search ................ 330/9, 330/308; 250/214 A
See application file for complete search history.

(56) References Cited

U.S. PATENT DOCUMENTS 5,144,169 A 9/1992 Hirabayashi et al.

2004/0184387 A1* 9/2004 Shirasaka et al. ........ 369/124.1

FOREIGN PATENT DOCUMENTS

| JP | 04-119005 | 4/1992 |
|----|-----------|--------|
| JP | 04-127703 | 4/1992 |
| JP | 04-129306 | 4/1992 |
| JP | 05-014075 | 1/1993 |
| JP | 08-070221 | 3/1996 |
| JP | 08-130421 | 5/1996 |
| JP | 2000-114888 | 4/2000 |
| JP | 2005-094149 | 4/2005 |

* cited by examiner

*Primary Examiner*—Robert Pascal
*Assistant Examiner*—Hieu Nguyen
(74) *Attorney, Agent, or Firm*—Morrison & Foerster LLP

(57) ABSTRACT

A photoreceptor amplifier circuit comprises a differential amplifier circuit, which includes a differential transistor pair constituted of two transistors and active loads corresponding to said differential transistor pair, said differential amplifier circuit outputting a voltage according to an output current of a photoreceptor. The photoreceptor amplifier circuit further comprises a correcting current generation circuit for generating a correcting current based on a current difference between said two transistors and supplying the correcting current to said differential amplifier circuit.

19 Claims, 10 Drawing Sheets

PHOTORECEPTOR AMPLIFIER CIRCUIT AND OPTICAL PICKUP

This Nonprovisional application claims priority under 35 U.S.C. § 119(a) on patent application Ser. No. 2004/203934 filed in Japan on Jul. 9, 2004, which was pending as of May 15, 2007, the entire contents of which are hereby incorporated by reference.

FIELD OF THE INVENTION

The present invention relates to a photoreceptor with a built-in circuit, used for an optical pickup for reproducing/recoding an optical disk. The present invention particularly relates to a photoreceptor amplifier circuit and an optical pickup suitable for a front monitor element for outputting a signal for monitoring/controlling laser power.

BACKGROUND OF THE INVENTION

An optical disk device for carrying out reproduction and recording of an optical disk includes an optical pickup for irradiating an optical disk with laser light for reproduction/recording, or receiving reflection light from the optical disk. The optical pickup includes a photoreceptor and a photoreceptor amplifier circuit. The photoreceptor converts the received reflection light or monitored laser light emitted from a laser light source into an electric signal, and the photoreceptor amplifier circuit amplifies this converted electric signal. Further, to take its advantage of easily realizing a small-sized optical pickup, a recent optical pickup often uses an IC in which a photoreceptor and a photoreceptor amplifier circuit are integrated in a single chip.

FIG. 8 illustrates a conventional photoreceptor amplifier circuit including a differential amplifier circuit. In this photoreceptor amplifier circuit, first, light received by a photodiode PD21 is converted into a photocurrent, and is further converted into a voltage in an inversion amplifier circuit (current-voltage conversion circuit) in which a differential amplifier circuit is connected to a feedback resistor R22, thereby generating an output voltage Vo proportional to the photocurrent. The differential amplifier circuit in the photoreceptor amplifier circuit includes transistors Q21 through Q25, and constant current generators CS21 and CS22.

The NPN-type transistors Q21 and Q22 are provided as a pair of differential transistors. The PNP-type transistor Q23 and Q24 constitute a current mirror circuit, and supply a collector current to the transistors Q21 and Q22, respectively. An input voltage Vin, as a reference voltage, is supplied to the base (non-inversion input terminal of a differential amplifier circuit) of the transistor Q21 via an input resistor R21. The photocurrent of the photodiode PD21 is supplied from the emitter of the transistor 25 via the resistor R22. Further, the constant current generator CS21 supplies a constant current so that the sum of the emitter currents of the transistors Q21 and Q22 becomes a constant value. The NPN-type transistor Q25 serving as an output transistor forms an emitter follower circuit, and outputs an output voltage Vo from a collector of the transistor Q24. The constant current generator CS22 supplies a constant current to the transistor Q25.

The following explains an offset voltage of this differential amplifier circuit. Note that, in the following explanation, all NPN transistors have a common characteristic, and all transistors have a common characteristic. Thus, variation between the transistors is not taken into account.

In the differential amplifier circuit shown in FIG. 8, the output current Vo is found as follows when no voltage is inputted.

$$Vo = Vin - (Ibn1 \times Rf) - Vben1 + Vben2 + (Ibn2 \times Rf) = Vin - (Rf \times Icn1/hFEn) - VT \times ln(Icn1/Is) + VT \times ln(Icn2/Is) + (Rf \times Icn2/hFEn) = Vin + ((Icn2-Icn1) \times Rf/hFEn) + VT \times ln(Icn2/Icn1)) \quad (1)$$

The parameters in the above figure are detailed below.

hFEn: rate of current amplification of NPN transistor
VT: thermoelectromotive force expressed as kT/q (k=Boltzmann's constant, T=absolute temperature, q=electronic charge)
Ibn1: base current of transistor Q21
Ibn2: base current of transistor Q22
Vben1: voltage between base-emitter of transistor Q21
Vben2: voltage between base-emitter of transistor Q22
Icn1: collector current of transistor Q21
Icn2: collector current of transistor Q22
Icp1: collector current of transistor Q23
Icp2: collector current of transistor Q24
Ibp1: base current of transistor Q23
Ibp2: base current of transistor Q24
Ibp3: base current of transistor Q25
Is: reverse saturation current of transistor (a constant depending on the structure etc. of the transistor)
Rf: resistance values of resistors R21 and R22

Accordingly, the voltage difference between the output voltage Vo and the reference voltage Vin, that is the offset voltage Voff, is denoted as follows.

$$Voff = Vo - Vin = ((Icn2-Icn1) \times Rf/hFEn) + VT \times ln(Icn2/Icn1) \quad (2)$$

This equation reveals that the offset voltage is caused by the difference between Icn1 and Icn2. On the contrary, when Icn1=Icn2, Voff becomes 0 and the offset voltage is not generated.

FIG. 9 illustrates another conventional photoreceptor amplifier circuit.

This photoreceptor amplifier circuit has the same structure as that of the circuit of FIG. 8, but additionally includes a NPN-type transistor Q26, a PNP-type transistor Q27, and constant current generators CS23 and CS24. Further, the transistor Q26 and the constant current generator CS23 are serially connected between the power supply voltage Vcc and the ground line. The transistor Q27 and the constant current generator CS24 are serially connected in the same manner. The base of the transistor Q26 is connected to the collector of the transistor Q23, and the base of the transistor Q27 is connected to the collector of the transistor Q24.

In this circuit shown in FIG. 9, Icn1 becomes identical to Icn2 by compensating the value of Ibp1+Ibp2, that is the base current of active load, so that the sum of those becomes Ibp3 (Ibp3=Ibp1+Ibp2); and also compensating Ibp3, the base current of output circuit, using a correcting current Ibn4 (Ibn4=Ibn3). As a result, Icn1 becomes equal to Icn2, thus obtaining Voff=0. Here, considering the Early effect of the transistors Q21 and Q22 constituting a differential pair, the condition Vben1=Vben2 cannot be obtained only by correction of base currents of the active load and the output circuit even when Icn1=Icn2. More specifically, when the collector—emitter voltages of the transistors Q21 and Q22 are respectively expressed as Vben1 and Vben2, they are found as follows.

$$Vben1 = VT \times ln(Icn1/(Is \times (1+(Vcen1/VA))))$$

$$Vben2 = VT \times ln(Icn2/(Is \times (1+(Vcen2/VA))))$$

Accordingly, the offset voltage Voff is found as follows.

$$V_{off}=V_o-V_{in}=((I_{cn2}-I_{cn1})\times R_f/h_{FEn})+ \\ VT\times ln((I_{cn2}\times(1+V_{cen1}/V_A)))/ \\ (I_{cn1}\times(1\times(V_{cen2}/V_A)))) \quad (3)$$

When Icn1=Icn2 in Formula (3), the offset voltage Voff is expressed as follows.

$$V_{off}=VT\times ln((V_A+V_{cen1})/(V_A+V_{cen2})) \quad (4)$$

However, in Formula (4), the condition Vcen1=Vcen2 must be met to obtain an offset voltage=0.

Here, the following explains the relation between the Early effect and the offset voltage. First, the following relation is found based on the first line of FIG. (1).

$$V_{off}=V_o-V_{in}=((I_{cn2}-I_{cn1})\times R_f/h_{FEn})+ \\ (V_{ben2}-V_{ben1})) \quad (A)$$

Meanwhile, Vben differs depending on whether the Early effect of transistor is taken into account. Vben in consideration of the Early effect and that ignoring the Early effect are respectively found as (B) and (C) below. This theory is applied also to Vben2.

$$V_{ben1}=VT\times ln(I_{cn1}/I_s) \quad (B)$$

$$V_{ben1}=VT\times ln(I_{cn1}/(I_s\times(1+(V_{cen1}/V_A))) \quad (C)$$

Formula (2) is obtained by applying Formula (B) to Formula (A), and Formula (3) is obtained by applying Formula (C) to Formula (A).

When the Early effect is not taken into account, Voff=0 in the circuit of FIG. 9. On the other hand, when the Early effect is taken into account, offset voltage is generated as shown in Formulas (1) through (3).

Since the photoreceptor amplifier circuit of FIG. 9 cannot satisfy the condition Vcen1=Vcen2, the photoreceptor amplifier circuit of FIG. 10, which satisfies Vcen1=Vcen2, has conventionally been used.

The photoreceptor amplifier circuit of FIG. 10 further includes NPN-type transistors Q28 and Q29 and a bias power source E, in addition to the structure of the photoreceptor amplifier circuit of FIG. 9. The transistor Q28 is connected between the transistors Q21 and Q23, and the transistor Q29 is connected between the transistors Q22 and Q24. The bias power source E is connected between the power source line and the respective bases of the transistors Q28 and Q29, and generates a bias voltage VB.

In this photoreceptor amplifier circuit, because of the transistors Q28 and Q29, the collector voltages VA of the transistors Q21 and Q22 both satisfy VA=Vcc−VB−Vben, thereby obtaining Voff=0.

Note that, Document 1 (FIG. 1) and Document 2 listed below are prior art documents disclosing circuits with a similar function to that of the circuit of FIG. 9, though their structures are not identical to FIG. 9. Document 1 discloses a differential amplifier circuit in which correction of base current and output operation are performed by a single common transistor. Document 2 discloses a circuit in which transistors constituting the current mirror circuit and the output transistor are all NPN-type transistors, and the correction of base current is performed by a single NPN-type transistor.

Further, Documents 3 through 7 listed below are prior art documents disclosing circuits with a similar function to that of the circuit of FIG. 10, though their structures are not identical to FIG. 10. These documents each teaches a similar differential pair to the differential pair constituted of the transistors Q21 and Q22, which is arranged so that the pair of circuits have an equal collector voltage.

Document 1: Japanese Laid-Open Patent Application Tokukai 2000-114888/2000 (published on Apr. 21, 2000)

Document 2: Japanese Laid-Open Patent Application Tokukaihei 08-130421/1996 (published on May 21, 1996)

Document 3: Japanese Laid-Open Patent Application Tokukaihei 05-14075/1993 (published on Jan. 22, 1993)

Document 4: Japanese Laid-Open Patent Application Tokukaihei 08-70221/1996 (published on Mar. 12, 1996)

Document 5: Japanese Laid-Open Patent Application Tokukaihei 04-127703/1992 (published on Apr. 28, 1992) (corresponding U.S. Pat. No. 5,144,169A1)

Document 6: Japanese Laid-Open Patent Application Tokukaihei 04-119005/1992 (published on Apr. 20, 1992)

Document 7: Japanese Laid-Open Patent Application Tokukaihei 04-129306/1992 (published on Apr. 30, 1992)

The front monitor element of an optical pickup is a laser intensity monitoring element which outputs a monitor voltage according to the intensity of received laser beam. The laser driver controls a driving current for the laser light source based on the monitor voltage fed back from the front monitor element so that the laser light source emits a laser beam at a predetermined intensity.

With the higher recording speed in recent years, the laser power for recording is increasing. However, there is a limit for output voltage of the front monitor element; for example, a monitor with a power source voltage=5V and a reference voltage=2.5V outputs a voltage less than 2.5V. Accordingly, when the amount of incident light increases due to an increase of laser power, the value of output voltage does not increase according to the intensity of incident light unless the sensitivity of the front monitor element is decreased. On the other hand, the laser power for reproduction is not required to be increased as much as the recording power, and therefore the decrease in sensitivity of front monitor element in accordance with the recording laser power results in a decrease in output signal for reproduction. Therefore, in order to, particularly upon reproduction, to output a voltage precisely reflecting the laser power, it is necessary to decrease the offset voltage and the offset voltage temperature characteristics.

In view of this, the differential amplifier circuit of FIG. 10 is arranged so that Icn1 is equal to Icn2 by meeting the condition: Ibp3=Ibp1+Ibp2, Ibp4=Ibn3, and also Vcen1 is equal to Vcen2 by addition of the transistors Q28 and Q29, thereby obtaining Voff=0. However, this photoreceptor amplifier circuit stops moving when the input voltage Vin exceeds VA+Vben1, and Vcen1 becomes 0. That is, in this photoreceptor amplifier circuit, the range of input voltage for starting operation is limited because of the presence of the transistors Q28 and Q29, resulting in incapability of processing a large signal.

SUMMARY OF THE INVENTION

The present invention is made in view of the foregoing conventional problems, and an object is to provide a photoreceptor amplifier circuit including a differential amplifier circuit that compensates an offset voltage results from the difference between Vcen 1 and Vcen 2 without using the transistors Q28 and Q29.

In order to solve the foregoing problems, a photoreceptor amplifier circuit comprises: a differential amplifier circuit, which includes a differential transistor pair constituted of two transistors and active loads corresponding to said differential transistor pair, said differential amplifier circuit outputting a voltage according to an output current of a photoreceptor; and a correcting current generation circuit for generating a correcting current based on a current difference between said two transistors and supplying the correcting current to said differential amplifier circuit.

With the foregoing arrangement, as shown in Formula (5) explained below, making a difference between the two currents in the differential transistor pair cancels the offset voltage. Therefore, by generating the current difference as a correcting current in the correcting current generation circuit and supplying the correcting current to the differential amplifier circuit, it is possible to compensate the offset voltage in the differential amplifier circuit.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

One embodiment of the present invention will be described below with reference to FIGS. 1 through 7.

Figure 1:
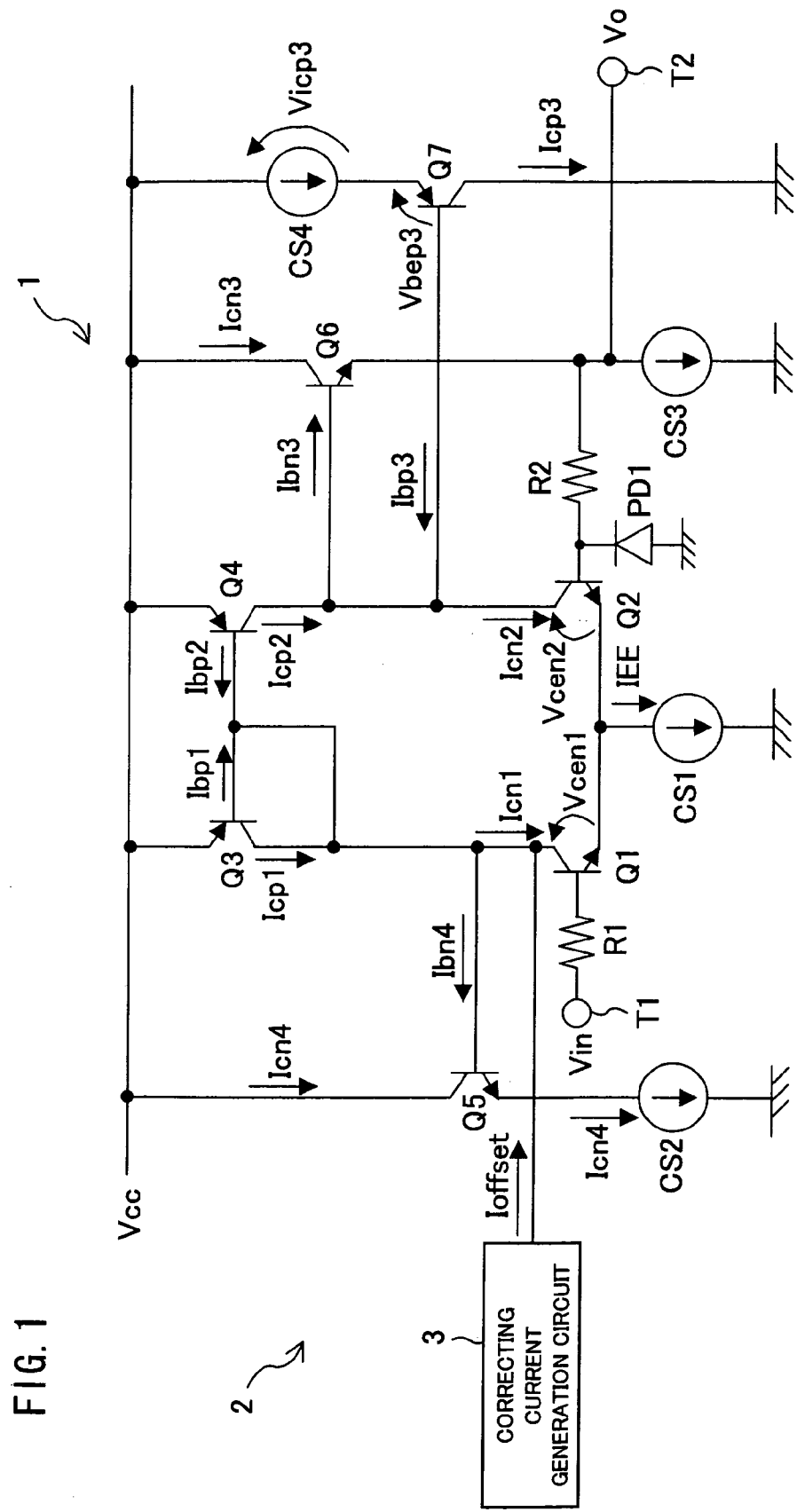
FIG. 1 is a circuit diagram illustrating a structure of a photoreceptor amplifier circuit according to First Embodiment of the present invention.

FIG. 1 illustrates a structure of a photoreceptor amplifier circuit 1 according to the present embodiment.

The photoreceptor amplifier circuit 1 includes a differential amplifier circuit 2, an input resistor R1 and a feedback resistor R2. Further, the differential amplifier circuit 2 includes transistors Q1 through Q7, constant current generators CS1 through CS4 and a correcting current generation circuit 3.

The NPN-type transistors Q1 and Q2 are provided as a pair of differential transistors in the differential amplifier circuit 2, and each emitter of those is connected to the constant current generator CS1. The constant current generator CS1 keeps a current IEE, which is the sum of the current Icn1 in the transistor Q1 and the current Icn2 in the transistor Q2, at a certain value. The reference voltage Vin is supplied to a reference voltage input terminal T1 as an input voltage. The input resistor R1 is connected between the reference voltage input terminal T1 and a base of transistor Q1, that is a non-inversion input terminal of the differential amplifier circuit 2.

Meanwhile, the base of the transistor Q2 serving as an inversion input terminal of the differential amplifier circuit 2 is connected to a cathode of a photodiode PD1 serving as a photoreceptor. The anode of the photodiode PD1 is connected to the ground line. Further, the base of the transistor Q2 is connected to the output terminal T2 of photoreceptor amplifier circuit 1 via the feedback resistor R2.

The PNP-type transistors Q3 and Q4, respectively serving as active loads of the transistors Q1 and Q2, constitute a current mirror circuit. The emitters of the transistors Q3 and Q4 are connected to a power source line to which a power source voltage Vcc is applied. Further, the bases of the transistors Q3 and Q4 are connected to each other, while both being connected to the collector of the transistor Q3. The collector of the transistor Q3 is connected to the collector of the transistor Q1 and the base of the transistor Q5, and is also connected to the correcting current generating circuit 3.

The collector of the NPN-type transistor Q5 is connected to the power source line. The constant current source CS2 is provided between the emitter of the transistor Q5 and the ground line. The collector of the transistor Q4 is connected to the respective bases of the transistors Q6 and Q7.

The collector of the NPN-type transistor Q6 is connected to the power source line. The constant current generator CS3 is provided between the emitter of the transistor Q6 and the ground line. The transistor Q6 serving as an output transistor forms an emitter follower circuit, and outputs an output voltage Vo from the emitter to the output terminal T2. The constant current generator CS4 is provided between the PNP transistor Q7 and the power source line. The collector of the transistor Q7 is connected to the ground line.

The correcting current generation circuit 3 generates a correcting current Ioffset, which is supplied to the collector of the transistor Q3 and the bases of the transistors Q3 and Q4. As described later, the correcting current Ioffset is determined based on the difference between the collector currents Icn1 and Icn2 of the transistors Q3 and Q4. The correcting current generation circuit 3 supplies the correcting current Ioffset to the collector of the transistor Q1.

In the differential amplifier circuit 2, the feedback resistor R2 is provided between the output terminal T2 and the non-inversion input terminal (base of the transistor Q2), constituting an inversion amplifier serving as a current-voltage conversion circuit. In this photoreceptor amplifier circuit 1, light received by a photodiode PD1 is converted into a photocurrent, and is further converted into a voltage in the inversion amplifier circuit, thereby generating an output voltage Vo proportional to the photocurrent.

The following explains the correcting current Ioffset generated in the correcting current generation circuit 3 of the photoreceptor amplifier circuit 1.

The parameters used in the figures below are detailed below.

hFEn: rate of current amplification of NPN transistor
hFEp: rate of current amplification of PNP transistor VT: thermoelectromotive force expressed as kT/q (k=Boltzmann's constant, T=absolute temperature, q=electronic charge)
VA: collector voltage of transistors Q1 and Q2
Vcen1: voltage between collector-emitter of transistor Q1
Vcen2: voltage between collector-emitter of transistor Q2
Icn1: collector current of transistor Q1
Icn2: collector current of transistor Q2
Icn3: collector current of transistor Q5
Icn4: collector current of transistor Q6
Icp1: collector current of transistor Q3
Icp2: collector current of transistor Q4
Ibp1: base current of transistor Q3
Ibp2: base current of transistor Q4
Ibp3: base current of transistor Q5
IEE: current in constant current generator CS1
Rf: resistance values of resistors R1 and R2

First, the voltage difference between the output voltage Vo and the reference voltage Vin is found according to the following formula.

$$Voff=Vo-Vin=((Icn2-Icn1)\times Rf/hFEn)+VT\times ln((Icn2\times(1+(Vcen1/VA)))/(Icn1\times(1+(Vcen2/VA))))$$

Since the first term of the foregoing formula relates to the difference between the base currents of the differential pair (differential transistor pair), this term is assumably almost 0, can be ignored. When the second term becomes 0 as shown in the formula below, Voff becomes 0.

$$VT\times ln((Icn2\times(1+(Vcen1/VA)))/(Icn1\times(1+(Vcen2/VA))))=0$$

Accordingly, $\Delta Icn$, the difference between Icn1 and Icn2, is found as follows.

$$(Icn2\times(1+(Vcen1/VA)))/(Icn1\times(1+(Vcen2/VA)))=1 \Delta Icn=Icn1-Icn2=(Icn2\times Vcen1-Icn1\times Vcen2)/VA \quad (5)$$

By thus setting the Icn1 and Icn2 as different values and satisfying the foregoing formula, the offset voltage Voff becomes 0. In other words, by setting the value of Ioffset according to the foregoing formula, and supplying this Ioffset to the collector of the transistor Q1 of the differential amplifier circuit 2, Voff becomes 0. The foregoing formula can be modified as follows.

$$\Delta Icn=Icn1-Icn2=(Icn2\times Vcen1-Icn1\times Vcen2)/VA=(Icn2/VA)\times Vcen1-(Icn1/VA)\times Vcen2$$

Here, considering that the difference between Icn1 and Icn2 is presumably small, the relation "Icn2/VA=Icn1/VA=Icn/VA=1/ro" (ro denotes a collector output resistor of transistors Q1 and Q2) is postulated. According to this, the correcting current Ioffset is expressed as follows.

$$\begin{aligned} Ioffset &= \Delta Icn \quad (6) \\ &= (Icn/VA)\times(Vcen1-Vcen2) \\ &= (Vcen1-Vcen2)/ro \\ &= \Delta Vce/ro \end{aligned}$$

According to the formula, a current with a value obtained by dividing $\Delta Vce$ (the difference between Vcen1 and Vcen2) by ro is most suitable for a correcting current for the differential amplifier circuit 2.

As described, the photoreceptor amplifier circuit 1 causes the correcting current generation circuit 3 to generate the correcting current Ioffset, which corresponds to the difference between the currents Icn1 and Icn2 in the differential transistor pair, and supplies this correcting current to the differential amplifier circuit 3. In this way, the offset voltage Voff in the differential amplifier circuit 2 is compensated. On this account, it is not necessary to provide a transistor dedicatedly used for offset voltage compensation. Consequently, the photoreceptor amplifier circuit 1 becomes immune to limitation for the range of input voltage, thus processing a large signal.

Further, this photoreceptor amplifier circuit 1 is capable of compensating the error due to the Early effect described in BACKGROUND OF THE INVENTION. When the required characteristic of the photoreceptor amplifier circuit 1 is so strict that the offset voltage due to the Early effect cannot be ignored, or when the photoreceptor amplifier circuit 1 is contained in an IC and includes a high-speed transistor for speedy processing, the Early effect must be taken into account. The photoreceptor amplifier circuit 1 ensures stable performance also in this case because the offset voltage due to the Early effect is compensated.

Note that, generally, the operation speed of transistor and the Early voltage trade off each other. That is, speedier operation of transistor makes the Early voltage lower, thus increasing the Early effect.

Figure 2:
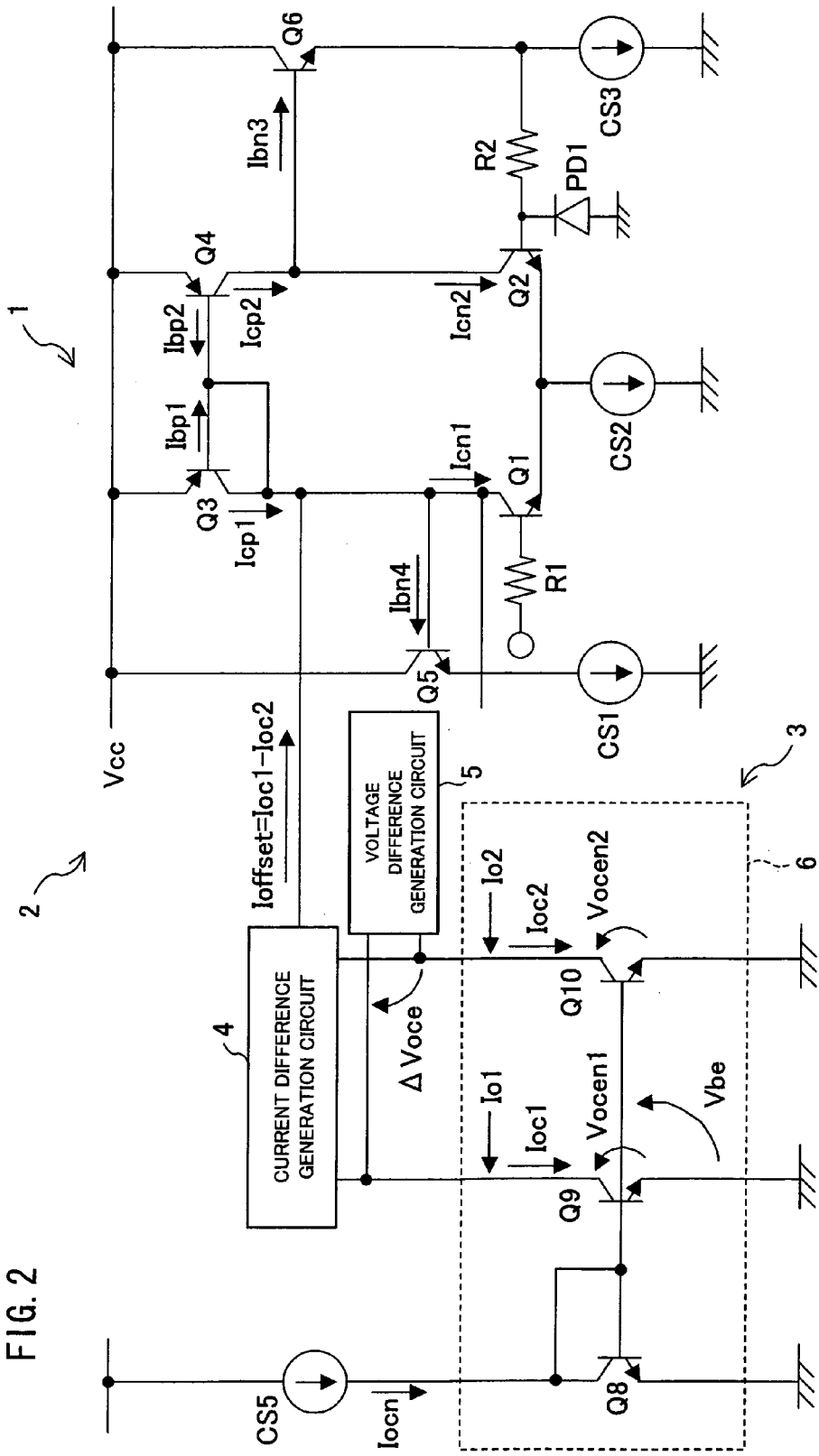
FIG. 2 is a circuit diagram illustrating a minute structure of a correcting current generation circuit of the foregoing photoreceptor amplifier circuit.

FIG. 2 shows a structure for generating the correcting current Ioffset of $\Delta Vce/ro$. In the photoreceptor amplifier circuit 1 shown in FIG. 2, the correcting current generation circuit 3 includes a current difference generation circuit 4, a voltage difference generation circuit 5, NPN-type transistors Q8 through Q10, and a constant current source CS5.

The constant current generator CS5 is provided between the collector of the transistor Q8 and the power source line. The collector and the base of the transistor Q8 are connected to each other. The bases of the transistors Q8 through Q10 are connected one another. Further, the emitters of the transistors Q8 through Q10 are all connected to the ground line. That is, the transistors Q8 through Q10 constitute a current mirror circuit 6.

The collectors of the transistors Q9 and Q10 are both connected to the current difference generation circuit 4 and the voltage difference generation circuit 5. The current difference generation circuit 4 serves to generate a difference between the collector current Ioc1 in the transistor Q9 and the collector current Ioc2 in the transistor Q10. The voltage difference generation circuit 5 serves to generate a voltage difference $\Delta Vce$ between the collector voltages of the transistors Q1 and Q2 constituting a differential pair.

In the foregoing photoreceptor amplifier circuit 1, the difference between the two collector currents can be found by the following formula where Vocen1 and Vocen2 denote collector—emitter voltages of the transistors Q9 and Q10, respectively.

$$Ioc1-Ioc2=(Is(1+(Vocen1/VA))\times exp(Vbe/VT))-(Is(1+(Vocen2/VA))\times exp(Vbe/VT))=((Vocen1-Vocen2)/VA)\times Is\times exp(Vbe/VT)$$

Here, the item "Is×exp (Vbe/VT)" is a collector current when the Early effect is not taken into account. The value of the item can be approximated by Iocn, as in the formula below.

$$Ioc1-Ioc2=(Vocen1-Vocen2)\times(Iocn/VA)=\Delta Voce\times(Iocn/VA) \quad (7)$$

The correcting current Ioffset supplied to the differential pair is obtained by $\Delta Vce/ro$, as shown in Formula (6). Thus, assuming that "Iocn=Icn" and "$\Delta Voce=\Delta Vce$" are satisfied, "Ioffset=Ioc1−Ioc2" is satisfied, and a desired correcting current value is obtained. Satisfying Iocn=Icn is equivalent to equalization of the output resistance (1/ro=Icn/VA) of the collector of the differential pair with the output resistance (1/ro=Ioc/VA) of the collector of the current mirror circuit 6.

Figure 3:
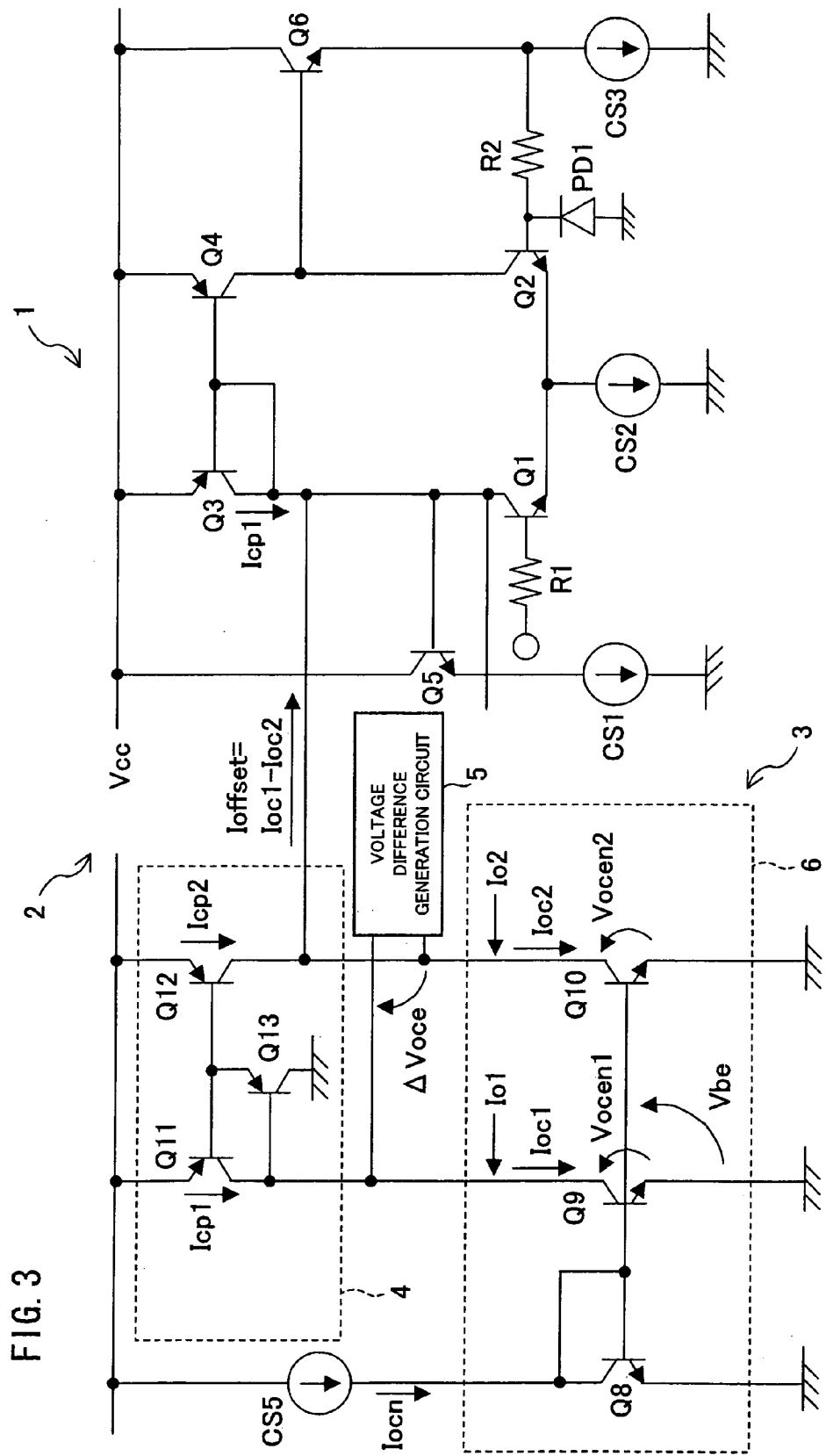
FIG. 3 is a circuit diagram illustrating a minute structure of a current difference generation circuit of the correcting current generation circuit of the photoreceptor amplifier circuit.

FIG. 3 illustrates a minute structure of the current difference generation circuit 4 in the photoreceptor amplifier circuit 1. As shown herein, the current difference generation circuit 4 includes PNP-type transistors Q11 through Q13.

The emitters of the transistors Q11 and Q12 are connected to the power source line. The bases of the transistors Q11 and Q12 are connected to each other, while both being connected to the emitter of the transistor Q13. The collector of the transistor Q13 is connected to the ground line. The collector of the transistor Q11 and the base of the transistor Q13 are both connected to the collector of the transistor Q9. The collector of the transistor Q12 is connected to the collector of the transistor Q10. This current difference generation circuit 4 constitutes a current mirror circuit 6 as with the foregoing case.

As shown in FIG. 3, by connecting the current mirror circuit 6 to the current mirror circuit of the current generation circuit 4, "Ioc1=Icp1=Icp2" is satisfied with respect to the relation among the aforementioned collector current Ioc1, the collector current Icp1 in the transistor Q11, and the collector current Icp2 in the transistor Q12. Therefore, with the presence of the current difference generation circuit 4, a relation "Icp2=Ioc2+Ioffset" is made. This further makes the following relation.

$$Ioffset=Icp2-Ioc2=Ioc1-Ioc2$$

The current mirror circuit of the current difference generation circuit 4 may have any arrangement; however, it is preferable that the particular error of base current induced in the current mirror circuit is reduced as much as possible so as to increase the accuracy of "Ioc1=Icp2", thereby ensuring the accuracy of the foregoing formula.

Figure 4:
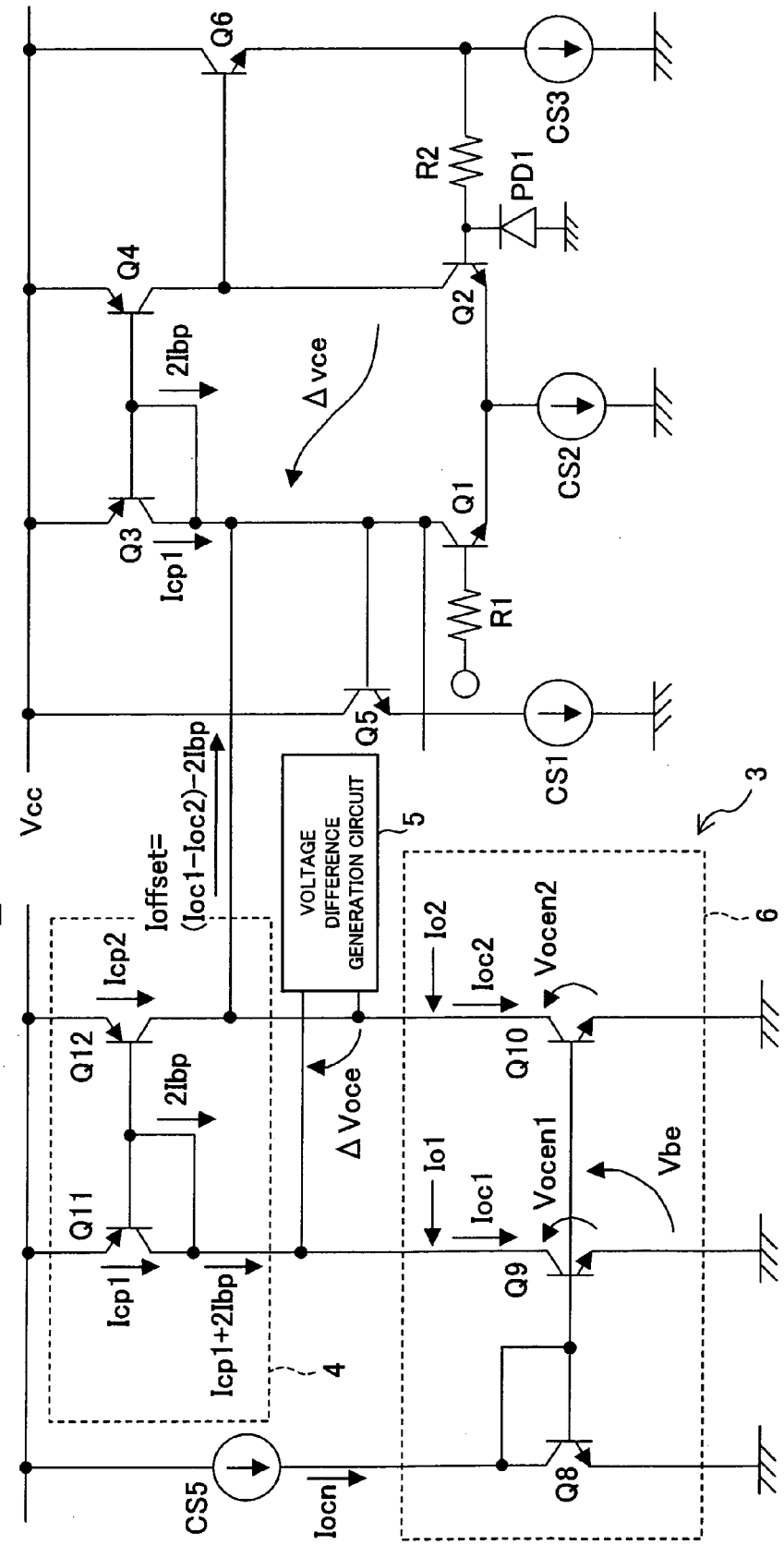
FIG. 4 is a circuit diagram illustrating a minute structure of another current difference generation circuit of the correcting current generation circuit of the photoreceptor amplifier circuit.

FIG. 4 shows a minute structure of another current difference generation circuit 4 of the photoreceptor amplifier circuit 1. As shown herein, the current difference generation circuit 4 is combined with the active loads (transistors Q3 and Q4) of the differential amplifier circuit 2, which is a current mirror circuit. That is, the base and the collector of the transistor Q1 are connected to each other. With this arrangement, correction of the error of base currents of the active loads and production of the correcting current Ioffset can be simultaneously performed.

Here, in FIG. 2, Icn1 and Icn2 are denoted as follows.

$$Icn1=Icp1+Ibp1+Ibp2-Ibn4-Ioffset$$

$$Icn2=Icp2-Ibn3$$

The relation "Icp1=Icp2" results from the characteristic of the current mirror circuit constituted of the transistors Q3 and Q4 serving as active loads. Accordingly, the difference between Icn1 and Icn2 is denoted as follows.

$$Icn1-Icn2=Ibp1+Ibp2+Ibn3-Ibn4-Ioffsetbp \qquad (8)$$

Here, Ioffsetbp denotes the correcting current for the error of base current of the active load. In the foregoing formula, assuming that "Ibp=Ibp1=Ibp2" and "Icn3=Icn4" are satisfied, a relation "Ibn3=Icn3/hFEn=Icn4/hFEn=Ibn4" is found. By approximating this relation by "IEE=2×Icp=Icp1+Icp2", Formula (8) is expressed as follows.

$$Icn1-Icn2=2\times Ibp-Ioffsetbp$$

This shows that the condition "Ioffsetbp=2×Ibp" needs to be met to cancel the difference between Icn1 and Icn2. In view of this, to correct the error of base current of the active load, the correcting current Ioffsetbp is removed from the collector of the transistor Q3.

Further, in this photoreceptor amplifier circuit 1, the correcting current Ioffset can be obtained based on the following relations between Ioc1, Ioc2 and 2Ibp, and Ioffset.

$$Ioc1=Icp1+2Ibp=Icp2+2Ibp=Ioc2+Ioffset+2Ibp$$

$$Ioffset=(Ioc1-Ioc2)-2Ibp \qquad (9)$$

In the formula above, (Ioc1−Ioc2) is equivalent to the correcting current based on ΔVce as described before, and "−2Ibp" denotes the correcting current for the error of base current of the active load. On this account, the offset voltage due to the base current error of the active load and the offset voltage based on ΔVce are corrected at the same time.

Figure 5:
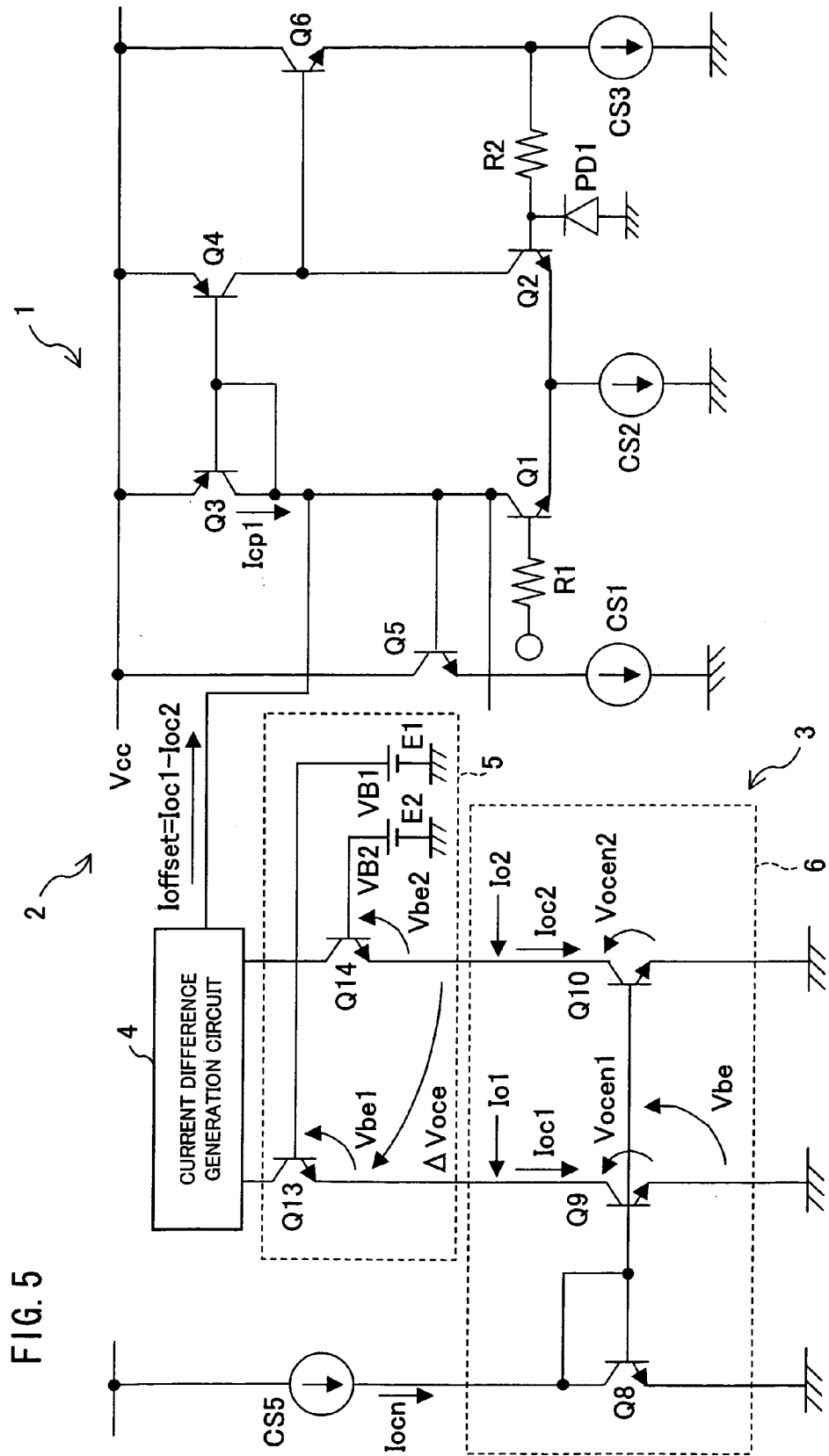
FIG. 5 is a circuit diagram illustrating a minute structure of a voltage difference generation circuit of the correcting current generation circuit of the photoreceptor amplifier circuit.

FIG. 5 illustrates a minute structure of the voltage difference generation circuit 5 of the photoreceptor amplifier circuit 1. As shown herein, the voltage difference generation circuit 5 includes NPN-type transistors Q13, Q14, and voltage sources E1, E2.

The collector of the transistor Q13 is connected to the current difference generation circuit 4 (collector of transistor Q11). The collector of the transistor Q14 is connected to the current difference generation circuit 4 (collector of transistor Q12). Further, the emitter of the transistor Q13 is connected to the collector of the transistor Q9 and the emitter of the transistor Q14 is connected to the collector of the transistor Q10. The base of the transistor Q13 is connected to the positive terminal of the voltage source E1 and the base of the transistor Q14 is connected to the positive terminal of the voltage source E2. The negative terminals of the voltage sources E1 and E2 are both connected to the ground line.

The voltage sources E1 and E2 are each constituted of a power source circuit or the like so as to output constant voltages (bias voltages) VB1 and VB2 which are supplied to the respective bases of the transistors Q13 and Q14. However, the voltage sources E1 and E2 are not limited to this structure, but may be constituted of a combination of a resistor and a current source, or may have a structure outputting a constant voltage by a diode or the like.

With the use of the voltage difference generation circuit 5, ΔVoce is expressed as follows.

$$\Delta Voce=(VB1-Vbe1)-(VB2-Vbe2)=VB1-VB2$$

However, it should be noted that the base-emitter voltages Vbe1 and Vbe2 of the transistors Q13 and Q14 have a relation: Vbe1=Vbe2.

Figure 6:
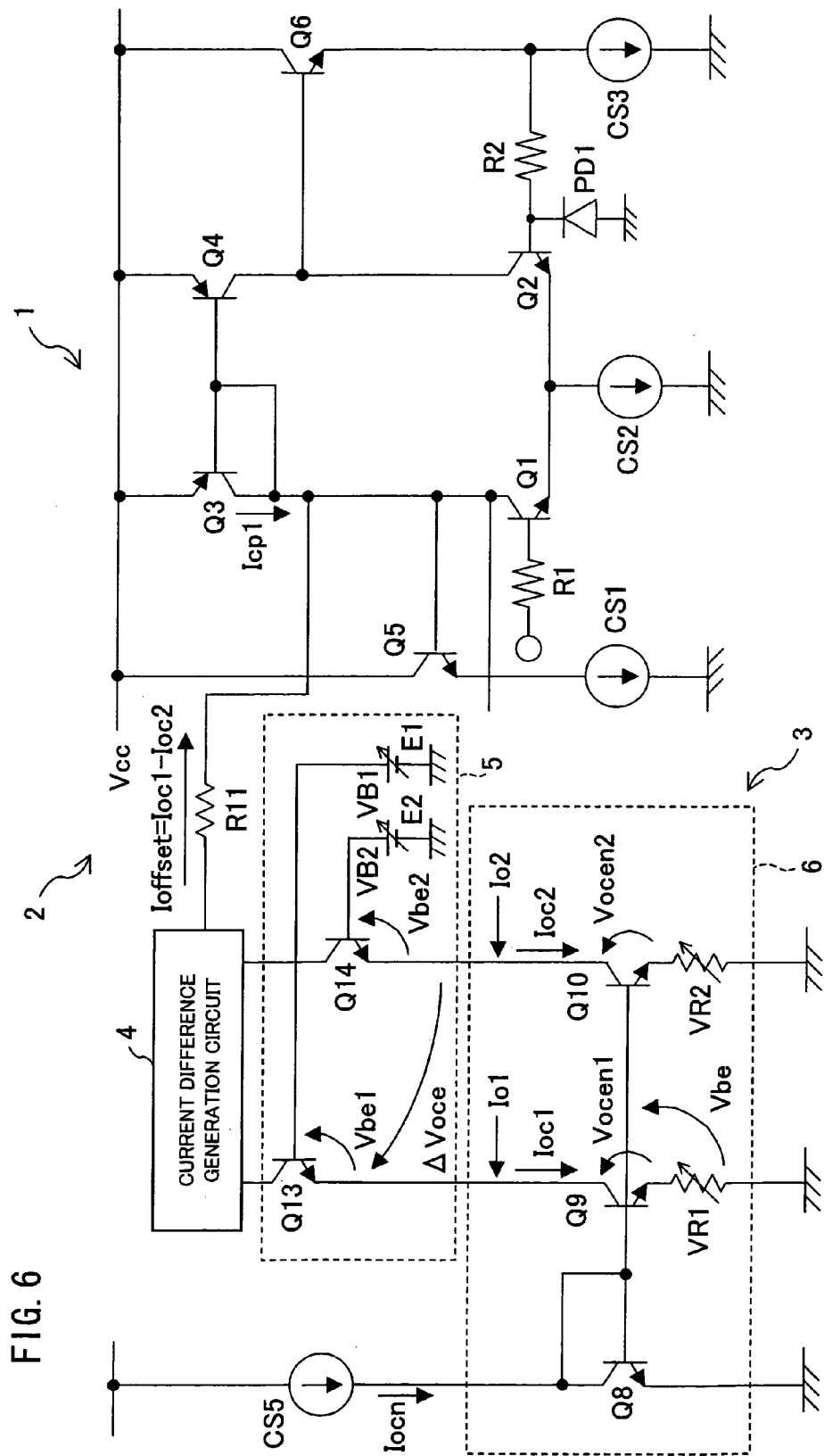
FIG. 6 is a circuit diagram illustrating a structure for carrying out minute control to obtain Iocn=Icn and Δ Voce=Δ vce, in the photoreceptor amplifier circuit.

In the IC chip in which the photoreceptor amplifier circuit 1 is formed, the conditions "Iocn=Icn" and "Δoce=ΔVce" cannot be satisfied in some cases depending on temperature gradient, element position etc. even when the circuit is designed to have the conditions. In this case, as shown in FIG. 6, one of the following arrangements (a) through (c), that enable minute control, is preferably provided. With such a function, minute control of the correcting current Ioffset according to the actual characteristic becomes possible.

(a) structure performing simultaneous or separate control of the output currents Ioc1 and Ioc2 of the current mirror circuit 6 (e.g. a structure in which variable resistors VR1 and VR2 are provided in the respective portions between the transistors Q9/10 and the ground line)

(b) structure performing minute control of the voltage difference outputted from the voltage difference generation circuit 5 (e.g. a structure in which the voltage sources E1 and E2 are variable-output-type voltage sources)

(c) structure performing minute control of the current difference outputted from the current difference generation circuit 4 (e.g. a structure in which a control resistor R11 is provided between the collectors of transistors Q12 and Q3)

Second Embodiment

Figure 7:
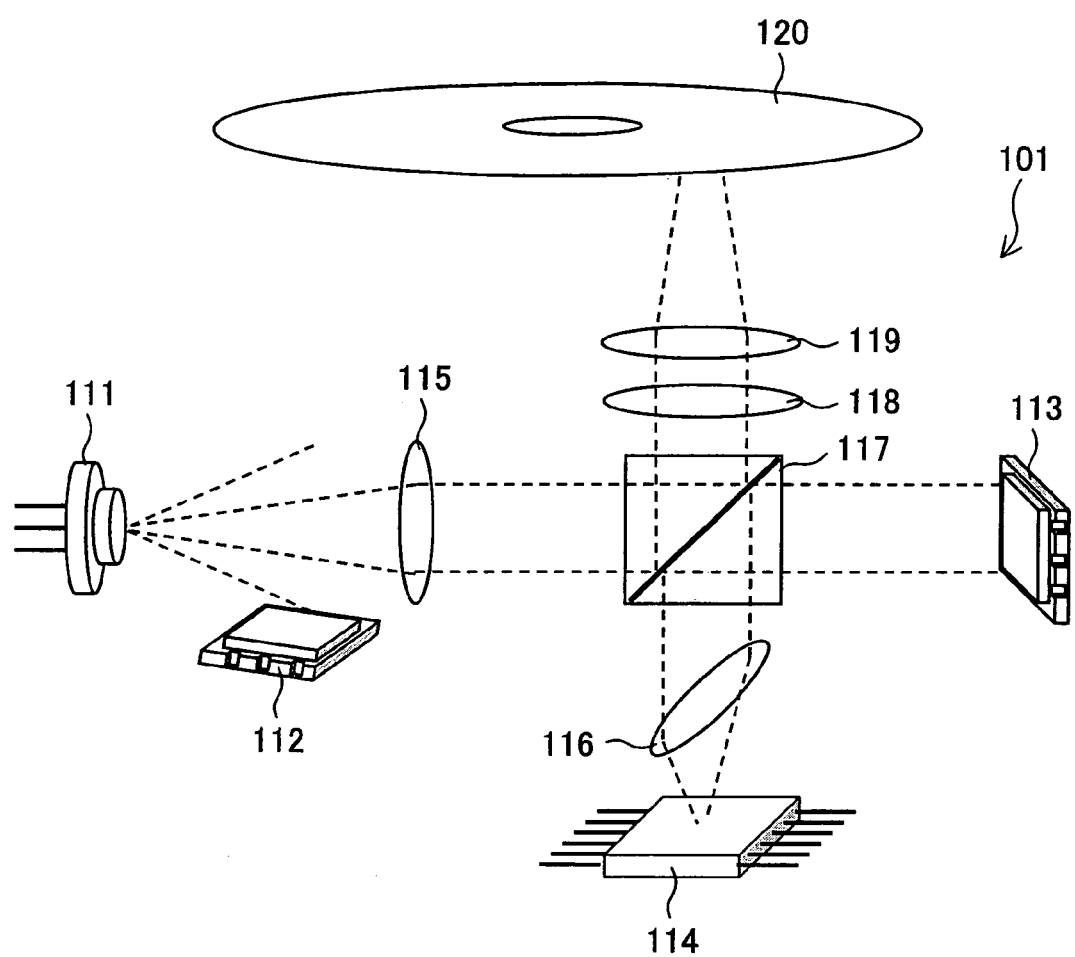
FIG. 7 is a drawing illustrating a structure of an optical pickup according to Second Embodiment of the present invention.
Figure 8:
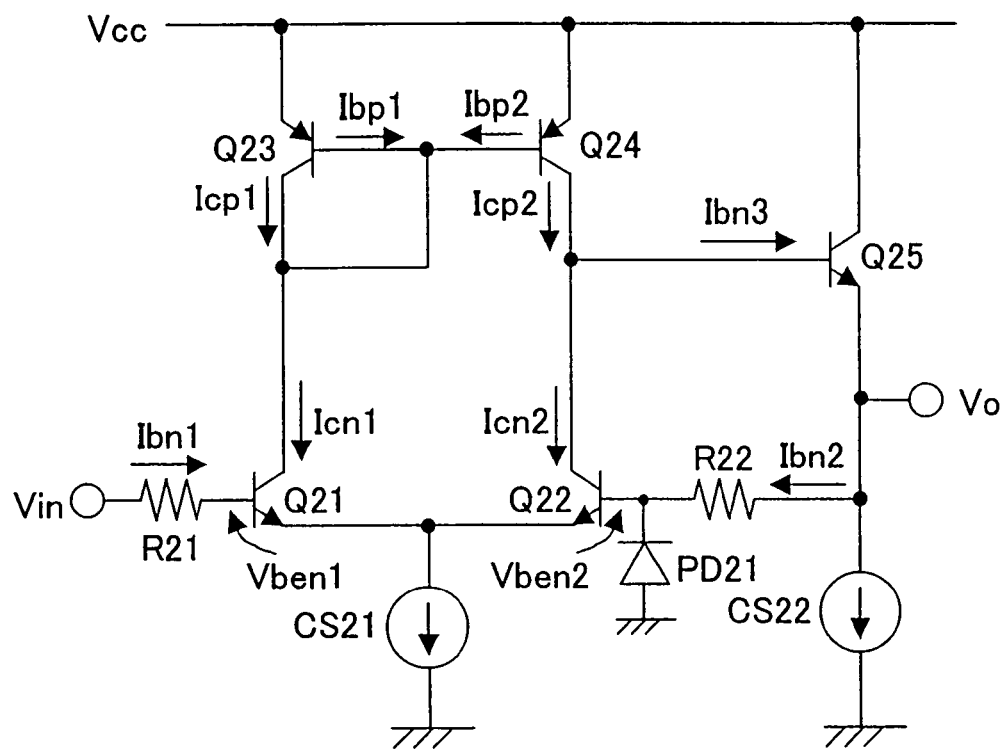
FIG. 8 is a circuit diagram illustrating a conventional photoreceptor amplifier circuit.
Figure 9:
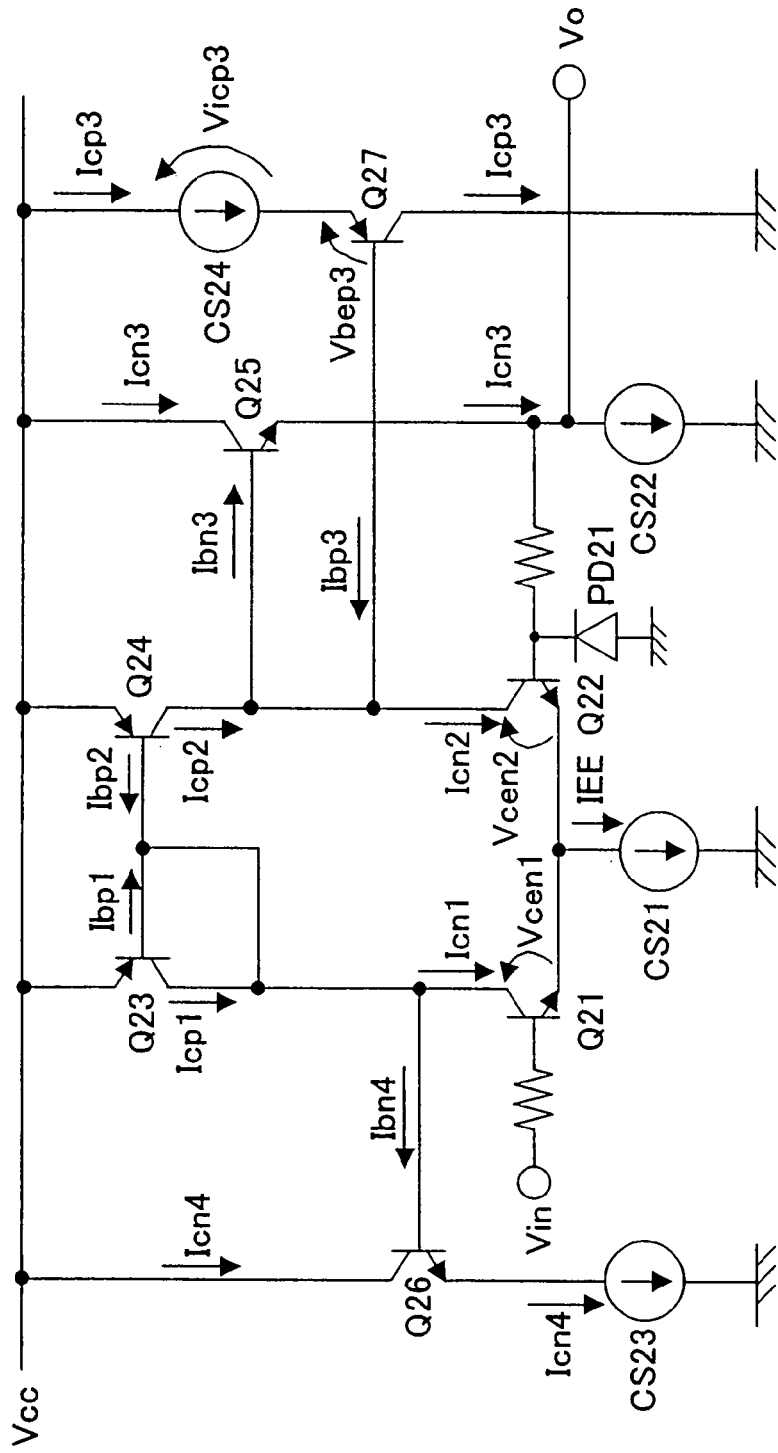
FIG. 9 is a circuit diagram illustrating another conventional photoreceptor amplifier circuit.
Figure 10:
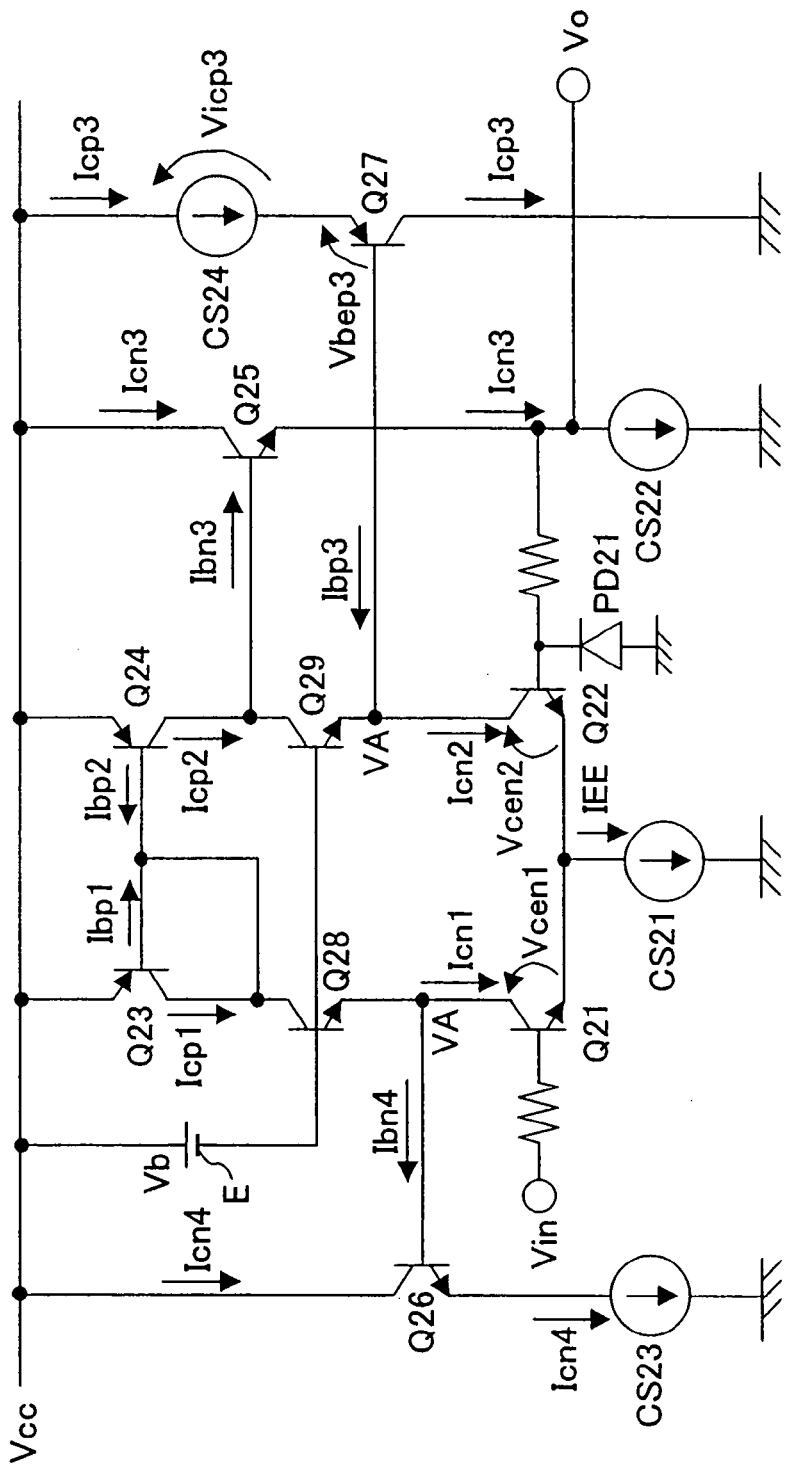
FIG. 10 is a circuit diagram illustrating still another conventional photoreceptor amplifier circuit.

The following will explain another embodiment of the present invention with reference to FIG. 7. For ease of explanation, materials having the equivalent functions as those shown in the drawings pertaining to First Embodiment above will be given the same reference symbols, and explanation thereof will be omitted here.

FIG. 7 illustrates a structure of an optical pickup 101 according to the present embodiment.

As shown in FIG. 7, the optical pickup 101 includes a laser diode 111, laser power monitor photoreceptor ICs 112 and 113, signal photoreceptor IC 114, a collimator lens 115, a spot lens 116, a beam splitter 117, a collimator lens 118 and an objective lens 119.

The laser diode 111, serving as a laser light source, emits two kinds of light, a 780 nm laser beam for CD and a 659 nm laser beam for DVD. The driving current supplied to the laser diode 111 is generated by a laser driver (not shown).

The laser power monitor photoreceptor ICs 112 and 113 each contain the photoreceptor amplifier circuit 1 according to First Embodiment with a photodiode PD1 on its light-receiving surface. The laser power monitor photoreceptor ICs 112 and 113 are each serving as an IC for receiving a part of laser beam emitted from the laser diode 111 and converting the beam into an electric signal which functions as a detection signal. The present embodiment requires at least one of the 112 and 113. Further, the position of the laser power monitor photoreceptor IC(s) 112/113 is not limited to the portion in the figure but may be anywhere they receives sufficient laser beam for detection.

In this optical pickup 101, the laser beam emitted from the laser diode 111 is converted into a parallel ray by the collimator lens 115, and the direction of the beam is changed by the beam splitter 117. The laser beam emitted from the beam splitter 117 passes through the collimator lens 118 before being converged on an optical disk 120 by the objective lens 119. The laser beam emitted from the optical disk 120 penetrates the beam splitter 117 via the objective lens 119 and the collimator lens 118, and is converged onto the signal photoreceptor IC 114 by the spot lens 116. In the signal photoreceptor IC 114, the laser beam is converted into an electric signal from which an RF signal, a tracking error signal etc. is produced.

In the meantime, the laser power monitor photoreceptor IC 112 and/or 113 receives the laser beam emitted from the laser diode 111, and detects the laser beam as an output voltage Vo (detection signal) by the photoreceptor amplifier circuit 1 contained therein. The laser driver controls the driving current of the laser diode by monitoring this detection signals from the laser power monitor photoreceptor IC 112 and/or 113, and keeps the laser power at a predetermined level.

As described, in the optical pickup 101, the laser power monitor photoreceptor IC 112 and/or 113 contains the photoreceptor amplifier circuit 1, allowing constantly canceling the offset voltage of the differential amplifier circuit 2 without influence of variation of element characteristic of transistor etc. or temperature. On this account, even when the sensitivity of the laser power monitor photoreceptor IC 112 and/or 113 is decreased when the laser power becomes lower upon reproduction than the recording power, it is possible to accurately detect laser beam (laser power) without influence of the offset voltage, thus accurately controlling the laser power.

Note that, though the present invention has described a structure in which the photoreceptor amplifier circuit 1 is contained in the laser power monitor photoreceptor IC 112 and/or 113 contains, an arrangement in which the photoreceptor amplifier circuit 1 is contained in the signal photoreceptor IC 114 is also allowable. The strict requirement of reduction of offset voltage for the laser power monitor photoreceptor IC 112 and/or 113 is not applied for the signal photoreceptor IC 114, however, the NPN transistor and the PNP transistor constituting the differential amplifier circuit are formed by greatly different processes due to their different characteristics, and therefore the offset voltage may exceed the specified value. Also in this case, the offset voltage can be decreased to the specified value with the use of photoreceptor amplifier circuit 1 of the present invention.

Overview of Embodiments

A photoreceptor amplifier circuit according to the present invention comprises: a differential amplifier circuit, which includes a differential transistor pair constituted of two transistors and active loads corresponding to said differential transistor pair, said differential amplifier circuit outputting a voltage according to an output current of a photoreceptor; and a correcting current generation circuit for generating a correcting current based on a current difference between said two transistors and supplying the correcting current to said differential amplifier circuit.

This photoreceptor amplifier circuit causes the correcting current generation circuit to generate the correcting current, which corresponds to the difference between the currents supplied to the differential transistor pair, and supplies this correcting current to the differential amplifier circuit. In this way, the offset voltage in the differential amplifier circuit is compensated. On this account, it is not necessary to provide a transistor dedicatedly used for offset voltage compensation. Consequently, the photoreceptor amplifier circuit becomes immune to limitation for the range of input voltage, thus processing a large signal. Thus, by using this photoreceptor amplifier circuit to the front monitor of the optical pickup device, it is possible to obtain output of light intensity detection for a wide range of input voltage.

The photoreceptor amplifier circuit is arranged so that said correcting current generation circuit generates said correcting current by dividing a collector voltage difference between said two transistors by a common collector output resistance of said two transistors. As shown in Formula (6) above, the current difference is denoted by a value obtained by dividing the collector voltage difference between the two transistors by a common collector output resistance of the two transistors. On this account, the correcting current generation circuit finds an adequate value of correcting current according to the formula.

The foregoing photoreceptor amplifier circuit is preferably arranged so that said correcting current generation circuit includes: a first current mirror circuit including a first and second transistors each having a collector output resistance same as the common collector output resistance; a voltage difference generation circuit for generating a voltage difference between two outputs of said first current mirror circuit, said voltage difference being same as the collector voltage difference; and a current difference generation circuit for generating a difference between two output currents of said first current mirror circuit. In this structure in which the correcting current generation circuit includes the first current mirror circuit, the voltage difference generation circuit, and the current difference generation circuit, it is possible to obtain a correcting current reflecting the collector voltage difference as a current difference between collector currents of the first and second transistors of the first current mirror circuit, as shown in FIG. (7).

The photoreceptor amplifier circuit is preferably arranged so that said current difference generation circuit includes a second current mirror circuit including a third transistor for supplying a current to said first transistor and a fourth transistor for supplying a current to said second transistor. With this arrangement, as shown in Formula (9), owing to the fact that the collector currents of the third and fourth transistors constituting the second current mirror circuit are equal, the collector current of the first and second transistors of the first current mirror circuit can be used as the correcting current.

The photoreceptor amplifier circuit is preferably arranged so that said second current mirror circuit has a same circuit layout as said active loads. With this arrangement, as shown in Formula (9), it is possible to simultaneously correct the offset voltage due to the difference in collector voltage of the differential transistor pair and the offset voltage based on the error of the base current of active loads.

The photoreceptor amplifier circuit is preferably arranged so that said voltage difference generation circuit includes a fifth and sixth transistors respectively provided in two current paths between said first current mirror circuit and said current difference generation circuit; and a voltage application circuit for applying voltages to respective bases of said fifth and sixth transistors with a same voltage difference as the collector voltage difference. With this arrangement, by applying the voltage from the voltage application circuit to the bases of the fifth and sixth transistors, the voltage difference between the collectors of the fifth and sixth transistors becomes equal to the collector voltage difference of the differential transistor pair On this account, an adequate voltage difference is given between the two outputs of the first current mirror circuit.

Ideally, the foregoing structure generates a voltage difference equal to the collector voltage difference; however, in some cases, those voltages are not completely equal due to the temperature gradient of the IC chip in which the photoreceptor amplifier circuit is formed, or difference in element positioning between the active loads and the second current mirror circuit.

In this view, the following adjustment circuits (a) through (c) are used for compensation of the error between the two voltages can be adopted. With these circuits, an adequate correcting current can be produced.

(a) an output current adjustment circuit for simultaneously or separately adjusting the two output currents used in the foregoing photoreceptor amplifier circuit including said first current mirror circuit (b) a voltage difference adjustment circuit for adjusting a voltage difference generated by said voltage difference generation circuit used in the foregoing photoreceptor amplifier circuit including the voltage difference generation circuit (c) a current difference adjustment circuit for adjusting an output current of said current difference generation circuit used in the foregoing photoreceptor amplifier circuit including the current difference generation circuit Further, with one of the foregoing photoreceptor amplifier circuits, an optical pickup of the present invention is capable of compensating the offset voltage of the differential amplifier circuit in the photoreceptor amplifier circuit. Particularly, when used for a front monitor element for outputting a signal for detecting laser intensity, the photoreceptor amplifier circuit outputs a voltage accurately reflecting the laser power for detection of intensity.

As described, the photoreceptor amplifier circuit generates the correcting current, which corresponds to the difference between the currents supplied to the differential transistor pair, and supplies this correcting current to the differential amplifier circuit. In this way, the offset voltage in the pair of transistors constituting the differential pair of differential amplifier circuit, which offset voltage is caused by the difference between Collector-emitter voltages of the two transistors, is compensated. On this account, it is not necessary to provide a transistor dedicatedly used for offset voltage compensation. Consequently, the differential amplifier circuit is suitably used for a front monitor element of an optical pickup, offering a function of outputting an accurate voltage corresponding to the laser power.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A photoreceptor amplifier circuit comprising:
a differential amplifier circuit, which includes a differential transistor pair constituted of two transistors and active loads corresponding to said differential transistor pair, said differential amplifier circuit outputting a voltage according to an output current of a photoreceptor; and
a correcting current generation circuit for generating a correcting current based on a current difference between said two transistors and supplying the correcting current to said differential amplifier circuit, wherein
said correcting current generation circuit generates said correcting current by dividing a collector voltage difference between said two transistors by a common collector output resistance of said two transistors, wherein
said correcting current generation circuit includes:
a first current mirror circuit including a first and second transistors each having a collector output resistance same as the common collector output resistance;
a voltage difference generation circuit for generating a voltage difference between two outputs of said first current mirror circuit, said voltage difference being same as the collector voltage difference; and
a current difference generation circuit for generating a difference between two output currents of said first current mirror circuit.

2. The photoreceptor amplifier circuit as set forth in claim 1, wherein:
said current difference generation circuit includes a second current mirror circuit including a third transistor for supplying a current to said first transistor and a fourth transistor for supplying a current to said second transistor.

3. The photoreceptor amplifier circuit as set forth in claim 2, wherein:
said second current mirror circuit has a same circuit layout as said active loads.

4. The photoreceptor amplifier circuit as set forth in claim 1, wherein:

said voltage difference generation circuit includes a fifth and sixth transistors respectively provided in two current paths between said first current mirror circuit and said current difference generation circuit; and a voltage application circuit for applying predetermined voltages to respective bases of said fifth and sixth transistors so that a voltage difference between collectors of the fifth and sixth transistors becomes equal to the collector voltage difference.

5. The photoreceptor amplifier circuit as set forth in claim 2, wherein:

said voltage difference generation circuit includes a fifth and sixth transistors respectively provided in two current paths between said first current mirror circuit and said current difference generation circuit; and a voltage application circuit for applying predetermined voltages to respective bases of said fifth and sixth transistors so that a voltage difference between collectors of the fifth and sixth transistors becomes equal to the collector voltage difference.

6. The photoreceptor amplifier circuit as set forth in claim 3, wherein:

said voltage difference generation circuit includes a fifth and sixth transistors respectively provided in two current paths between said first current mirror circuit and said current difference generation circuit; and a voltage application circuit for applying predetermined voltages to respective bases of said fifth and sixth transistors so that a voltage difference between collectors of the fifth and sixth transistors becomes equal to the collector voltage difference.

7. The photoreceptor amplifier circuit as set forth in claim 1, wherein:

said first current mirror circuit includes an output current adjustment circuit for simultaneously or separately adjusting the two output currents.

8. The photoreceptor amplifier circuit as set forth in claim 1, further comprising:

a voltage difference adjustment circuit for adjusting the voltage difference generated by said voltage difference generation circuit.

9. The photoreceptor amplifier circuit as set forth in claim 1, further comprising:

a current difference adjustment circuit for adjusting an output current of said current difference generation circuit.

10. An optical pickup including a photoreceptor amplifier circuit for detecting light intensity of a laser beam, the photoreceptor amplifier circuit comprising:

a differential amplifier circuit, which includes a differential transistor pair constituted of two transistors and active loads corresponding to said differential transistor pair, said differential amplifier circuit outputting a voltage according to an output current of a photoreceptor; and a correcting current generation circuit for generating a correcting current based on a current difference between said two transistors and supplying the correcting current to said differential amplifier circuit, wherein said correcting current generation circuit generates said correcting current by dividing a collector voltage difference between said two transistors by a common collector output resistance of said two transistors, wherein said correcting current generation circuit includes:

a first current mirror circuit including a first and second transistors each having a collector output resistance same as the common collector output resistance;

a voltage difference generation circuit for generating a voltage difference between two outputs of said first current mirror circuit, said voltage difference being same as the collector voltage difference; and a current difference generation circuit for generating a difference between two output currents of said first current mirror circuit.

11. The optical pickup as set forth in claim 10, wherein:

said current difference generation circuit includes a second current mirror circuit including a third transistor for supplying a current to said first transistor and a fourth transistor for supplying a current to said second transistor.

12. The optical pickup as set forth in claim 11, wherein:

said second current mirror circuit has a same circuit layout as said active loads.

13. The optical pickup as set forth in claim 10, wherein:

said voltage difference generation circuit includes a fifth and sixth transistors respectively provided in two current paths between said first current mirror circuit and said current difference generation circuit; and a voltage application circuit for applying predetermined voltages to respective bases of said fifth and sixth transistors so that a voltage difference between collectors of the fifth and sixth transistors becomes equal to the collector voltage difference.

14. The optical pickup as set forth in claim 11, wherein:

said voltage difference generation circuit includes a fifth and sixth transistors respectively provided in two current paths between said first current mirror circuit and said current difference generation circuit; and a voltage application circuit for applying predetermined voltages to respective bases of said fifth and sixth transistors so that a voltage difference between collectors of the fifth and sixth transistors becomes equal to the collector voltage difference.

15. The optical pickup as set forth in claim 12, wherein:

said voltage difference generation circuit includes a fifth and sixth transistors respectively provided in two current paths between said first current mirror circuit and said current difference generation circuit; and a voltage application circuit for applying predetermined voltages to respective bases of said fifth and sixth transistors so that a voltage difference between collectors of the fifth and sixth transistors becomes equal to the collector voltage difference.

16. The optical pickup as set forth in claim 10, wherein:

said first current mirror circuit includes an output current adjustment circuit for simultaneously or separately adjusting the two output currents.

17. The optical pickup as set forth in claim 10, further comprising:

a voltage difference adjustment circuit for adjusting the voltage difference generated by said voltage difference generation circuit.

18. The optical pickup as set forth in claim 10, further comprising:

a current difference adjustment circuit for adjusting an output current of said current difference generation circuit.

19. The optical pickup as set forth in claim 10, further comprising:

said photoreceptor amplifier circuit is used for detection of intensity of a laser beam emitted from a laser light source.

* * * * *